United States Patent [19]
Karayianis et al.

[11] 4,197,483
[45] Apr. 8, 1980

[54] SUBMILLIMETER WAVE GENERATION USING SURFACE ACOUSTIC WAVES IN PIEZOELECTRIC MATERIALS

[75] Inventors: Nick Karayianis; Donald E. Wortman, both of Rockville, Md.

[73] Assignee: The United States of America as represented by the Secretary of the Army, Washington, D.C.

[21] Appl. No.: 952,521

[22] Filed: Oct. 18, 1978

[51] Int. Cl.² ............................................. H01J 25/00
[52] U.S. Cl. ........................................ 315/4; 315/3; 315/3.6; 315/39.3; 330/5.5; 331/107 A
[58] Field of Search ................. 315/3, 4, 5, 3.6, 39.3; 330/5.5, 43; 331/107 A

[56] References Cited
U.S. PATENT DOCUMENTS

| 2,634,372 | 4/1953 | Salisbury | 315/4 X |
| 2,894,222 | 7/1959 | Goldan | 315/3.6 |
| 2,939,998 | 6/1960 | Salisbury | 315/4 |
| 3,195,072 | 7/1965 | Steinbrecher | 315/3.6 X |
| 3,231,779 | 1/1966 | White | 315/4 |
| 3,340,416 | 9/1967 | Young | 315/4 |
| 3,622,833 | 11/1971 | Takeda et al. | 315/4 |
| 3,903,486 | 9/1975 | Bert et al. | 315/4 |

Primary Examiner—Saxfield Chatmon, Jr.
Attorney, Agent, or Firm—Nathan Edelberg; Robert P. Gibson; Saul Elbaum

[57] ABSTRACT

A generator for variable frequency submillimeter waves launches surface acoustic waves in piezoelectric material for generation of an associated acousto-electrical field. An electron beam is acted upon by the acousto-electrical field in a manner simulating the effect of an etched grating, resulting in an output frequency which may be varied by the variation of the acoustic wave frequency, or the velocity of the electron beam.

13 Claims, 6 Drawing Figures

SUBMILLIMETER WAVE GENERATION USING SURFACE ACOUSTIC WAVES IN PIEZOELECTRIC MATERIALS

RIGHTS OF THE GOVERNMENT

The invention described herein may be manufactured, used, and licensed by or for the United States Government for governmental purposes without the payment to us of any royalty thereon.

BACKGROUND OF THE INVENTION

The present invention relates to generators for use in the near millimeter wave region of the spectrum, and more particularly to generators, operating in that portion of the spectrum, capable of modulation and generating a variable frequency signal.

The need for generation capability of frequencies in the 100 GHz to 1,000 GHz range is established, in areas such as radar for military application.

Prior art generators in this frequency range utilize an etched grating on a metallic surface. The grating provides an interruption in an electromagnetic field generated by a moving electron beam, thus generating a particular frequency which is a function of the spacing of the ruled lines in the grating, the velocity of the electron beam, and the angle at which the output is observed.

However, the utilization of a fixed, etched grating upon a metallic surface does not permit for variation of the output frequency except by variation of the velocity of the electron beam or of the angle of observation of the output result, both processes involving complicated procedures. Specific references in disclosing related devices include Volume SU-20, *IEEE Transactions on Sonics and Ultrasonics*, No. 2, April, 1973, pages 173 et seq, disclosing an acoustic signal storage device. However, no disclosure is provided of frequency variation methods or apparatus, and a disclosed structure utilizes a normally incident beam to store an acoustic pattern on a piezoelectric crystal. In a letter published in the *Proceedings of the IEEE*, February, 1970, pages 253–4, an electron beam, normally incident to an elastic surface, is used to read out surface waves on the surface.

In Volume 12, No. 5 of *Soviet Physics-Solid State*, November, 1970, pages 1189 et seq, plasma waves are used in a semiconductor in conjunction with an electron beam to provide energy to an acoustic wave. The electron beam is used to create a movement of charge in the surface, and plasma waves are set up to enhance the effect. While the reference discloses the interaction of an electron beam with a surface wave, the interaction relates to plasma surface waves in a semiconductor, and not to acoustic waves in a piezoelectric crystal as presently disclosed.

In Volume 18 of *Soviet Physics*-Solid State, No. 11, November, 1976, pages 1982 et seq, an article appears relating to amplification and generation of surface electro-acoustic waves at an interface between piezoelectric and nonpiezoelectric semiconductors. The concept, however, calls for transfer of energy into the surface acoustic waves, rather than the presently contemplated energy transfer from the acoustic waves via an electron beam to electromagnetic radiation in the near millimeter frequency range.

In summary, no prior art disclosures are known to the applicants which suggest either the concept or an apparatus for utilizing an interaction between an electron beam and a surface acoustic wave on a piezoelectric crystal to generate electromagnetic waves in the near millimeter spectrum, or the further variability or modulation of the output frequency of such generated waves by variation of the acoustic wave frequency.

SUMMARY OF THE INVENTION

The present invention permits straightforward and more easily achieved variation of the output frequency of a generator in the near millimeter range than previously available. Such frequency variability permits useful applications of the output of a high-frequency generator, such as transmission of information by modulation of the output frequency. Utilization of the present invention permits frequency variation by presently available techniques as well as by additional methods to be described in the sequel.

The inventive concept improves upon the prior art use of an etched grating on a metallic surface by launching a surface acoustic wave in a piezoelectric material and using the resulting acousto-electric field to simulate the effects of an etched grating in an interaction with an electron beam. Because the acoustic wave propagates along the surface of the piezoelectric material and may be launched at varying frequencies, a moving grating having variable line spacing is simulated.

In summary, the present invention effectively provides a movable grating, having a variable line spacing, thereby permitting the presently available techniques and devices for frequency variation in the 100 GHz–1,000 GHz range to be used more simply, economically, and effectively. Moreover, new methods and apparatus for frequency variation are enabled by the variation of the effective spacing between the simulated grating lines through modulation or alteration of the acoustic wave frequency.

These and other objects, features and advantages of the present invention will become more readily apparent from the following specification and appended claims, when considered in conjunction with the attached drawings.

DETAILED DESCRIPTION OF THE INVENTION

It is known that acoustic waves traveling in piezoelectric materials generate electromagnetic field regions both above and within the material. An electron beam passed through the electromagnetic field, above the material, will thus encounter alternating regions of the field.

The beam, by encountering the alternating regions of the field, is thus alternately accelerated and decelerated thereby, thus causing electromagnetic radiation.

Figure 1:
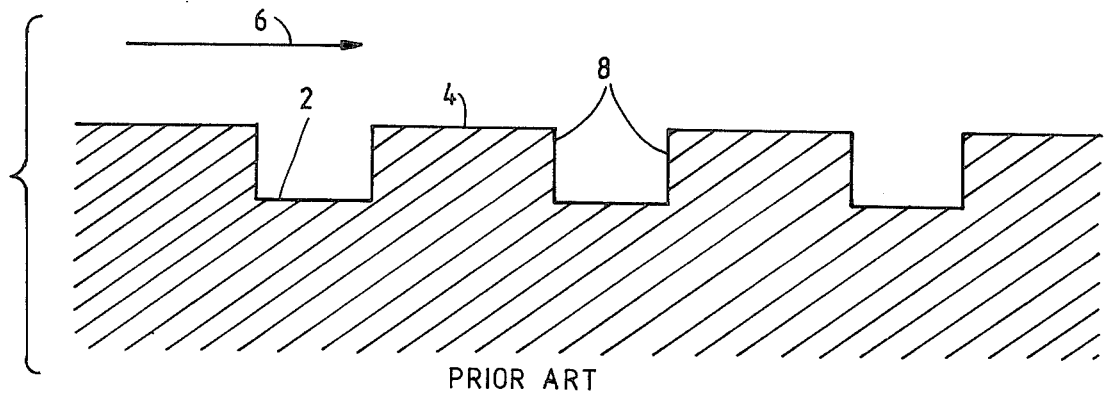
FIG. 1 shows a prior art apparatus for generation of frequencies in the millimeter range.

Referring to the figures, FIG. 1 illustrates the prior art approach to generation of frequencies in the millimeter range. Specifically, a metal grating, comprising etched lines, shown at 2, for example, are provided in a metallic member 4.

An electron beam, symbolically shown at 6, travels above the surface of the metal, and upon encountering the discontinuities 8, causes radiation of electromagnetic energy by processes well known to those skilled in the art.

Figure 2:
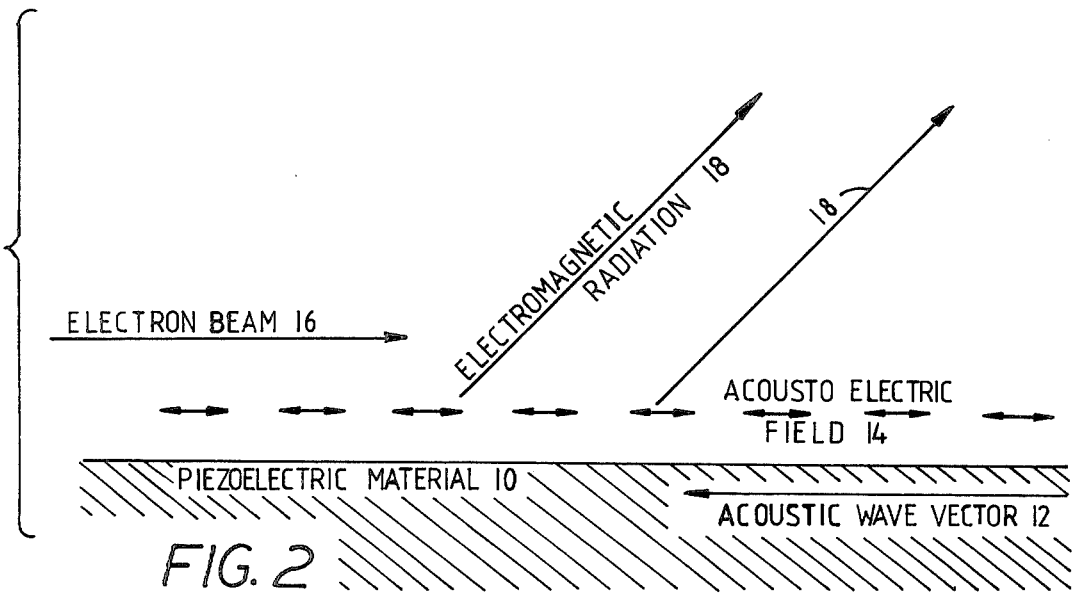
FIG. 2 illustrates a principle utilized in the present invention.

FIG. 2 illustrates the principle utilized in the present invention, wherein a piezoelectric material 10 is utilized in generation of electromagnetic radiation, rather than prior art utilization of metals.

No etched lines are required in an apparatus according to the present invention. The essential effect of a grating is simulated by an acoustic wave traveling along the surface of the piezoelectric material. The wave, essentially shown as a vector 12, may be generated by an alternating signal applied to transducers at the surface of the material, not shown in the figure. The wave may be introduced into the material 10 at either its right or left ends with respect to the orientation shown in the figure.

It is appreciated that the signal may be launched within the piezoelectric crystal and similar effects produced. However, for greatest efficiency, it is preferred to launch the signal and hence the acoustic wave, along the surface of the crystal.

As is known to those skilled in the art, the acoustic wave 12 will generate an electromagnetic field above the surface of the material, shown symbolically by arrows 14, as well as an image field generated within the material, not shown herein. An electron beam, illustrated at 16, is caused to travel above the surface of the piezoelectric material, and thus encounters the electromagnetic field 14, previously described. As a result of the repeated acceleration and deceleration of the electrons in beam 16 caused by the field 14, electromagnetic radiation is generated, shown at 18, having a frequency substantially given by Equation 1.

$$F = (V_e + V_s)/\lambda_s \qquad (1)$$

In the equation, F is the output frequency of radiation, $V_e$ is the velocity of the electron beam, $V_s$ is the velocity of the acoustic surface wave, and $\lambda_s$ is the wavelength of the acoustic wave.

This equation is derived in an internal document written by the inventors, "Proposal for Generating Submillimeter Waves," R-RCB-77-6, at Harry Diamond Laboratories, Army Materiel Command, Adelphi, Md., 20783, Mar. 30, 1977, incorporated herein by reference. The equation may be restated as $$F = F_s(1 + V_e/V_s) \qquad (2)$$

Thus, the output frequency of radiation may be varied by altering $V_e$ (in either magnitude or direction, or $F_s$ (the acoustic wave frequency). Reference to direction of $V_e$ is with respect to the orientation of the acoustic wave vector 12.

When computations are carried out to the same degree of accuracy as Equation 1, the generated frequency in the present instance is substantially pure, in comparison with the frequency generated in the prior art device as shown in FIG. 1. Prior art generated electromagnetic fields include components of differing frequencies, the detected frequency component depending upon the angle of observation. In the present apparatus, the frequency is essentially independent of the angle of observation. Although radiated frequency is independent of angle, the intensity of the emitted radiation is a function of the observation angle, however.

Figure 3:
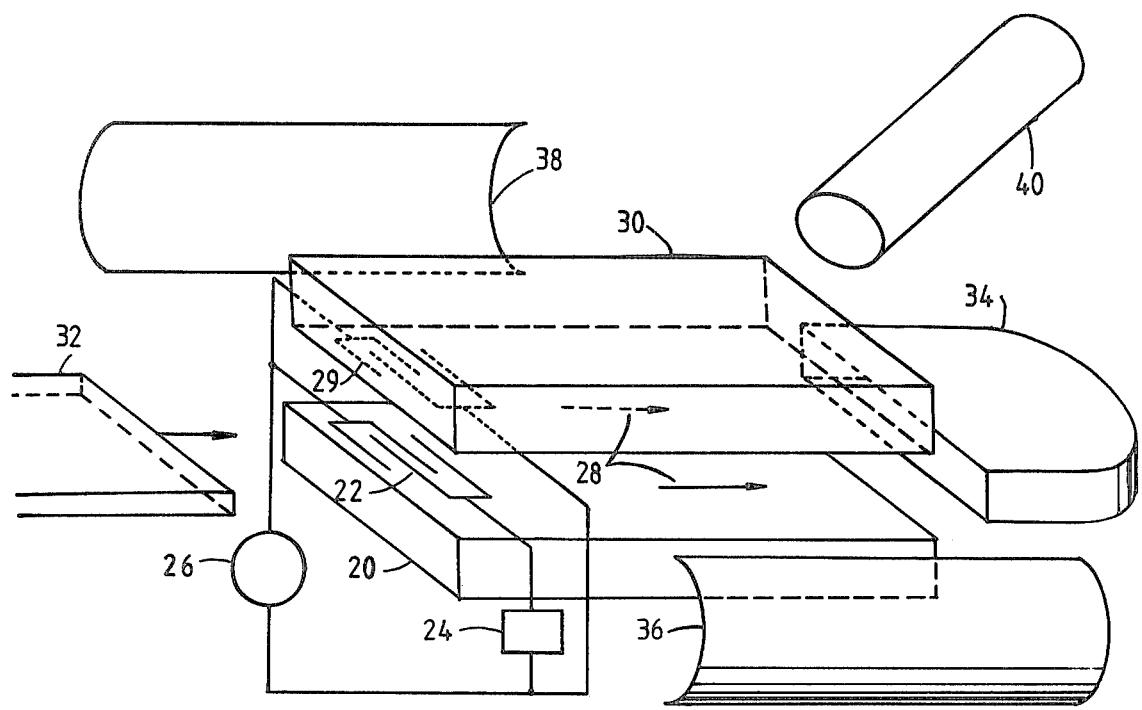
FIG. 3 shows one embodiment utilizing the inventive concepts.

FIG. 3 illustrates one embodiment which utilizes the inventive concepts, and includes a piezoelectric crystal 20, specifically shown as comprising lithium niobate (LiNbO$_3$) having thereon an acoustic transducer 22, coupled by a phase adjusting means 24 to a standard, variable frequency acoustic generator 26. An acoustic wave is generated in the crystal and travels on its surface in the longitudinal direction, shown at 28. The surface acoustic wave (SAW) may be generated at a frequency of 10 MHz.

The disclosed structure utilizes a second crystal 30, spaced apart from crystal 20 and parallel thereto. Crystal 30 is provided with a transducer 29, also driven by generator 26. The acoustic wave launched by transducer 29 in crystal 30 is shown in dashed line, and is also labeled 28. The crystals may be separated by a distance of 0.1 cm, for example. Crystal 30 is used to enhance performance and operation of the device, and is not a necessary requirement for its operation in accordance with the inventive concept. Since each crystal is provided with a transducer for launching SAWs therein, phase adjusting means 24 is used to cancel the phase difference (if any) between the transducers. As a result, the embodiment of FIG. 3 produces SAWs which are spatially in phase in the two crystals. The SAWs, propagating along the surfaces of crystals 20 and 30, produce alternating electric fields in the space between the surfaces, as shown in FIG. 2.

An electron beam, shown as a sheet beam 32, is introduced into the area between crystals 20 and 30, thus traveling "above" (or outside) the surfaces of both crystals in the region of the alternating acousto-electric field produced by the SAWs. The beam is generated by a standard electron gun assembly, not shown, known to those skilled in the art. The sheet beam may have typical dimensions of 1 cm×0.08 cm at an energy of approximately 30 KEv. The beam may be kept collimated by a DC magnetic field, produced by standard means not shown and known to routineers in the art. The magnetic field is applied parallel to the electron beam.

A catcher 34 is provided for the electron beam for recovery of some of the energy contained therein. Two reflectors, 36 and 38, are provided for tuning the cavity and peaking the generated energy at a particular frequency. While the presently preferred reflectors include a variable position cylindrical or spherical reflector 36 and a fixed cylindrical reflector 38, it is recognized that other arrangements may similarly be used. In operation, the position of reflector 36 is adjusted to obtain maximal coherent electromagnetic radiation in the cavity. A standard coupler 40 is utilized to couple out the generated energy, comprising electromagnetic radiation of approximately 0.1 cm wavelength.

Since the acousto-electric field accelerates and decelerates the electrons, there results (in addition to radiation of electromagnetic waves) a bunching effect on the electrons. Accordingly, one possible use of the invention is to collect and add the emitted radiation to radiation stimulated in appropriately tuned cavities by the bunched electron beam.

Figure 4:
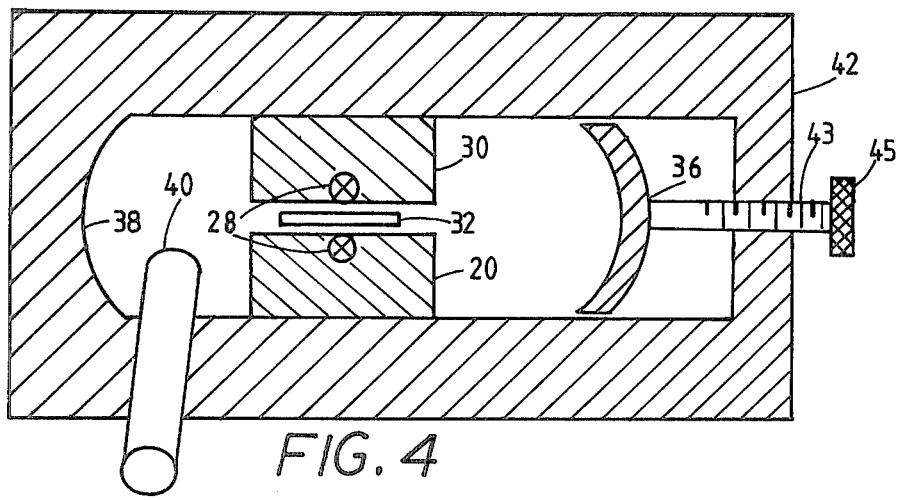
FIG. 4 shows a side view of the embodiment shown in FIG. 3.

FIG. 4 shows a side view of the embodiment described in FIG. 3, including conductor 42 to illustrate the device in its assembled form. In the side view, it is seen that fixed reflector 38 may be a part of the cavity formed by the enclosing conductor 42. The adjusting means for reflector 36 is shown as a threaded screw 43, having a knurled knob 45. Other adjusting means may be used.

Figure 5:
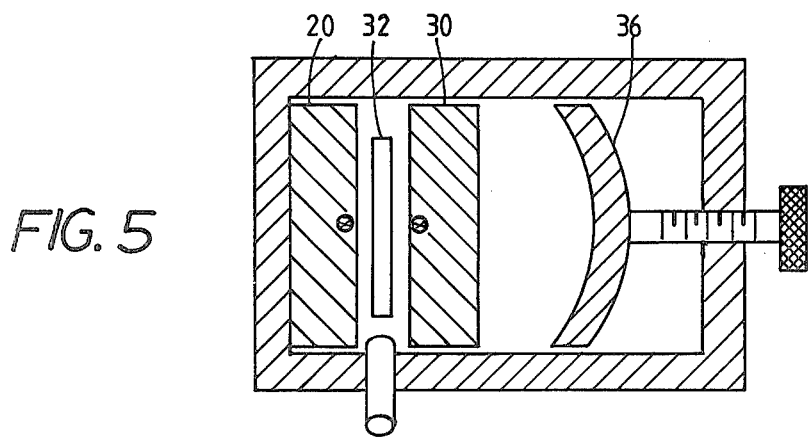
FIG. 5 shows a variation of the embodiment of FIGS. 3 and 4.

Performance of the apparatus may be improved by utilization of a configuration such as shown in FIG. 5, wherein crystals 20 and 30, as well as the sheet beam 32, are essentially rotated by 90 degrees from the positioning illustrated in FIG. 4. The improved alteration results from the fact that the bulk of the radiation intensity, previously described as being angle dependent, is emanated in a direction normal to the surface of the piezoelectric crystals.

Figure 6:
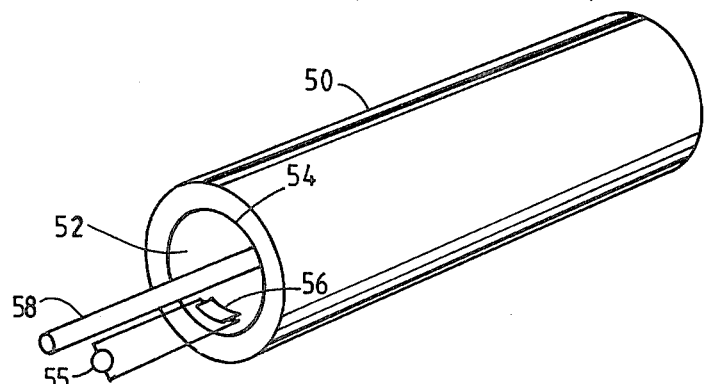
FIG. 6 shows an alternate embodiment of the invention.

It is appreciated that other embodiments may be utilized to provide the beneficial result of the present invention. Specifically, the cavity within the described embodiment may be formed by any number of crystals, including a single, cylindrical crystal as described below. Thus, for example, a cylindrical crystal 50 may be used as shown in FIG. 6. The crystal has a hollow cavity 52, the inner surface 54 being excited by a variable frequency generator 55 via an acoustic transducer, partially shown symbolically at 56, but which may extend completely around the inside circumference of the cylinder. The resultant acoustic wave travels axially within the cylinder. A pencil electron beam, shown at 58, provices electrons in a coaxial direction within the cylindrical cavity formed by crystal 50. The pencil electron beam interacts with the surface acoustic wave in the manner previously described to produce electromagnetic radiation according to the present invention.

We wish it to be understood that we do not desire to be limited to the exact details of construction shown and described, for obvious modifications can be made by a person skilled in the art.

We claim:
1. Generator for electromagnetic waves by interaction of an electron beam with an acousto-electric field, comprising:
  (a) means for conducting acoustic waves and generating a resultant acousto-electric field;
  (b) means for launching an acoustic wave in said means for conducting;
  (c) means for generating an electron beam for interacting with said acousto-electric field, and
  (d) means for coupling generated electromagnetic radiation resulting from said interaction between said electron beam and said acousto-electric field to receiving means;
  (e) whereby electromagnetic radiation is produced at a frequency dependent upon the frequency of said acoustic wave and the velocity of said electron beam and is variable therewith.

2. Generator as recited in claim 1 wherein said means for conducting comprises a piezoelectric crystal.

3. Generator as recited in claim 1 wherein said means for launching comprises means for launching a surface acoustic wave in said means for conducting.

4. Generator as recited in claim 1 wherein said means for conducting comprises a piezoelectric crystal, and said means for launching comprises means for launching a surface acoustic wave in said piezoelectric crystal.

5. Generator as recited in claim 4 wherein said means for launching a surface acoustic wave comprises a signal generator and transducing means located at the surface of siad piezoelectric crystal, said transducing means receiving the output signals of said signal generator.

6. Generator as recited in claim 5 wherein said signal generator comprises a variable frequency generating means.

7. Generator as recited in claim 6 wherein said means for conducting comprises a plurality of spaced-apart piezoelectric crystals, coupled by said transducing means to receive outputs of said variable frequency generating means.

8. Generator as recited in claim 7 further comprising phase adjusting means for cancelling phase differences between said transducing means associated with said plurality of spaced-apart crystals.

9. Generator as recited in claim 8 wherein said means for generating an electron beam comprises means for generating a sheet beam traversing the space between said plurality of crystals, and
  further comprising:
    collecting means for said electron beam, and
    collimating means for said electron beam during its passage through the space between said plurality of crystals.

10. Generator as recited in claim 6 wherein said means for conducting forms a cavity coupled by said transducing means to said variable frequency generating means.

11. Generator as recited in claim 10 wherein said cavity is formed by two parallel crystals.

12. Generator as recited in claim 10 further comprising means for tuning said cavity and peaking the generated electromagnetic radiation at a particular frequency.

13. Generator as recited in claim 10 wherein said conducting means is cylindrically structured, thereby forming a cylindrical cavity therein, and
  wherein said means for generating an electron beam comprises means for generating a pencil electron beam coaxial with said cylindrical cavity.

* * * * *